US009801301B1

(12) United States Patent
Costello (10) Patent No.: US 9,801,301 B1
(45) Date of Patent: Oct. 24, 2017

(54) CABLE BACKPLANE SYSTEM HAVING INDIVIDUALLY REMOVABLE CABLE CONNECTOR ASSEMBLIES

(71) Applicant: TYCO ELECTRONICS CORPORATION, Berwyn, PA (US)

(72) Inventor: Brian Patrick Costello, Scotts Valley, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/161,734

(22) Filed: May 23, 2016

(51) Int. Cl.
| | |
|---|---|
| *H05K 7/10* | (2006.01) |
| *H05K 7/14* | (2006.01) |
| *H01R 12/72* | (2011.01) |
| *H01R 13/631* | (2006.01) |
| *H01R 13/6461* | (2011.01) |

(52) U.S. Cl.
CPC ......... *H05K 7/1447* (2013.01); *H01R 12/727* (2013.01); *H01R 13/631* (2013.01); *H01R 13/6461* (2013.01); *H05K 7/1491* (2013.01); *H05K 7/1492* (2013.01)

(58) Field of Classification Search
CPC   H01R 13/6587; H01R 12/737; H01R 12/724; H01R 13/6586; H01R 13/743; H01R 12/716; H01R 25/003; H01R 11/282; H01R 12/53; H01R 13/629; H01R 13/6582; H01R 13/6588; H01R 12/7011; H01R 12/712; H01R 12/722; H01R 12/75; H01R 13/46; H01R 13/631; Y10T 29/49826; H05K 1/117; H05K 2201/10356; H05K 7/1491
See application file for complete search history.

(56) References Cited

U.S. PATENT DOCUMENTS

| | | | | |
|---|---|---|---|---|
| 5,184,961 | A | * | 2/1993 | Ramirez .............. H01R 13/518 439/248 |
| 6,047,172 | A | * | 4/2000 | Babineau ............. H05K 9/0058 361/800 |
| 6,824,311 | B2 | * | 11/2004 | Chen ..................... G02B 6/3821 385/78 |
| 7,137,847 | B2 | | 11/2006 | Trout et al. |
| 7,553,188 | B2 | | 6/2009 | Whiteman, Jr. et al. |
| 7,597,587 | B1 | | 10/2009 | Duesterhoeft |
| 9,160,088 | B2 | * | 10/2015 | Rossman ........... H01R 12/7005 |
| 9,209,539 | B2 | * | 12/2015 | Herring .................... H04Q 1/15 |
| 9,673,559 | B1 | * | 6/2017 | Rossman ............. H01R 13/512 |

(Continued)

*Primary Examiner* — James Wu
*Assistant Examiner* — Michael Matey (57) ABSTRACT

A cable backplane system includes cable backplanes each including a tray configured to be coupled to a chassis and a plurality of cable connector assemblies mounted to the tray. The tray has a plate extending between a front and a rear with mounting locations receiving corresponding cable connector assemblies. The trays are oriented parallel to each other with front openings between the fronts of the plates and rear openings between the rears of the plates. Each cable connector assembly has a housing holding contacts terminated to corresponding cables. Each cable connector assembly has a holder mounted to the corresponding mounting location of the plate. The holder is mounted to the plate and removable from the plate through the rear opening at the rear of the plate.

19 Claims, 7 Drawing Sheets

(56) References Cited

U.S. PATENT DOCUMENTS

2014/0004723 A1* 1/2014 Costello ............... H05K 7/1438
439/64
2015/0162680 A1* 6/2015 Costello ............... H01R 9/2408
439/64

* cited by examiner

CABLE BACKPLANE SYSTEM HAVING INDIVIDUALLY REMOVABLE CABLE CONNECTOR ASSEMBLIES

BACKGROUND OF THE INVENTION

The subject matter herein relates generally to a cable backplane system for interconnecting electrical components in a communication system.

Communication systems, such as network systems, servers, data centers, and the like, use large printed circuit boards, known as backplanes, to interconnect midplanes, daughtercards, line cards and/or switch cards. The communication systems generally use high speed differential pair connectors mounted to the backplane and high speed differential pair connectors mounted to the line cards and switch cards to transmit signals therebetween. The backplane interconnects the various connectors using traces within the circuit board.

The backplanes are typically mounted vertically at a rear of the chassis with the backplane connectors positioned at the front of the backplane. The removable cards are typically loaded into the chassis in a mating direction through the front with the removable cards mated with corresponding backplane. The backplane is oriented perpendicular to the mating direction and covers the rear of the chassis. The backplane blocks airflow through the chassis by restricting front-to-back airflow. Furthermore, the backplane connectors are only accessible from the front. To replace one of the backplane connectors, a significant part of the system must be disassembled and the backplane removed from the chassis. Moreover, interconnection of components on different chassis requires a separate connection system which adds complexity and cost to the system.

A need remains for a backplane system that allows assembly and disassembly of components without interrupting other parts of the system.

BRIEF DESCRIPTION OF THE INVENTION

In one embodiment, a cable backplane system is provided including cable backplanes each including a tray configured to be coupled to a chassis and a plurality of cable connector assemblies mounted to the tray. The tray has a plate extending between a front and a rear. The plate has mounting locations receiving corresponding cable connector assemblies. The trays of the cable backplanes are oriented parallel to each other with front openings between the fronts of the plates and with rear openings between the rears of the plates. Each cable connector assembly has a housing holding contacts terminated to corresponding cables and configured for mating with mating contacts of a corresponding card connector mated to the cable connector assembly in a mating direction parallel to the plates. Each cable connector assembly has a holder mounted to the corresponding mounting location of the plate. The holder is mounted to the plate and removable from the plate through the rear opening at the rear of the plate.

In another embodiment, a cable backplane system is provided including cable backplanes each comprising a tray configured to be coupled to a chassis and a plurality of cable connector assemblies mounted to the tray. The tray has a plate extending between a front and a rear. The plate has mounting locations receiving corresponding cable connector assemblies. The plate has slots at the mounting locations. The trays of the cable backplanes are oriented parallel to each other with openings between the fronts of the plates and between the rears of the plates. Each cable connector assembly has a housing holding contacts terminated to corresponding cables and configured for mating with mating contacts of a corresponding card connector mated to the cable connector assembly in a mating direction parallel to the plates. Each cable connector assembly has a holder mounted to the corresponding mounting location of the plate. The holder has a base below the contacts with tabs extending therefrom. The tabs are received in corresponding slots in the plate to locate the cable connector assembly relative to the plate. The holder has a fastener removably fastened to the plate to secure the cable connector assembly to the plate.

In a further embodiment, a cable backplane system is provided including a cable connector assembly configured to be mounted to a tray. The cable connector assembly has a housing holding contacts terminated to corresponding cables and configured for mating with mating contacts of a corresponding card connector mated to the cable connector assembly. The cable connector assembly has a holder including a top plate, a bottom plate and side plates defining a cavity that receives the housing. The bottom plate has a plurality of mounting tabs extending therefrom below the bottom plate. The mounting tabs are configured to locate the cable connector assembly relative to the tray. The bottom plate has a fastener configured to engage the tray to secure the cable connector assembly to the tray.

DETAILED DESCRIPTION OF THE INVENTION

Figure 1:
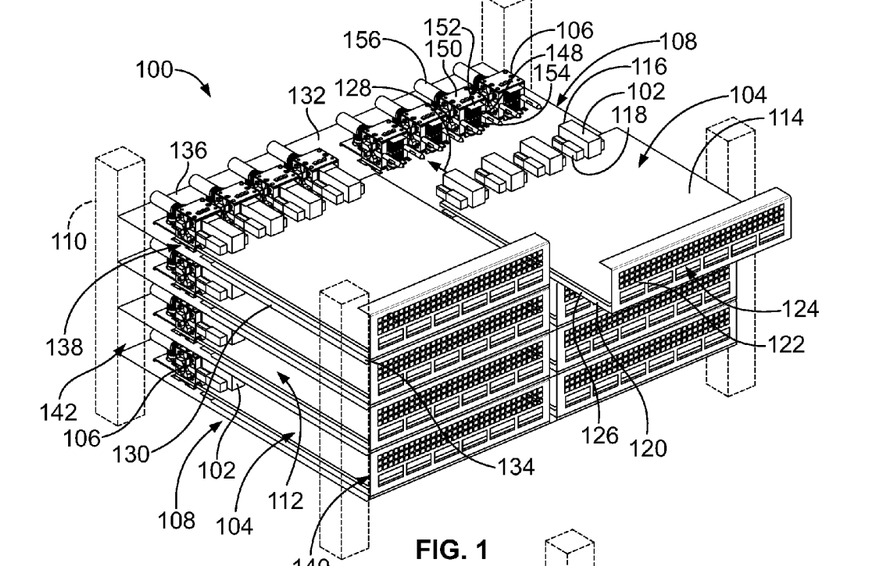
FIG. 1 is a front perspective view of a cable backplane system formed in accordance with an exemplary embodiment.
Figure 2:
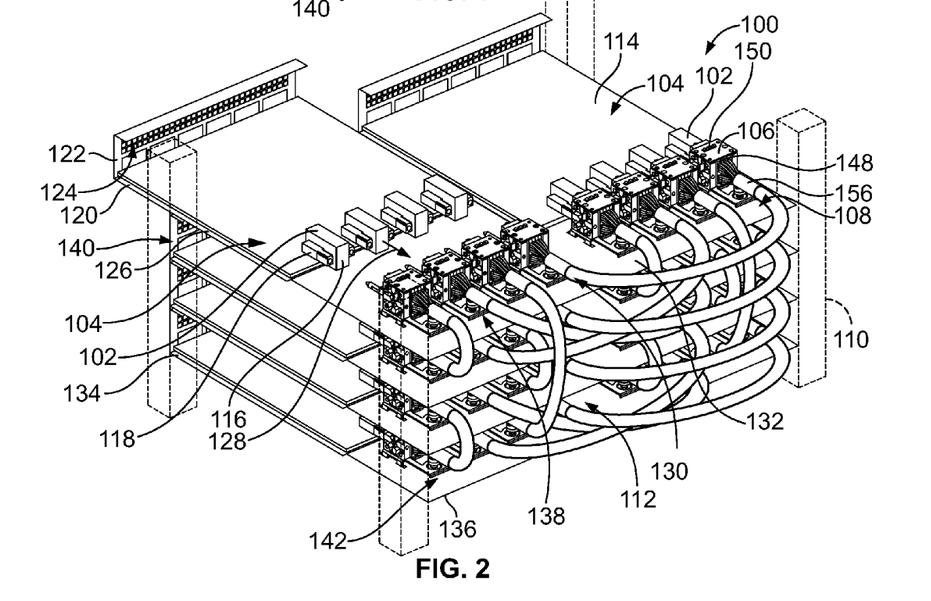
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a server or a network switch. The cable backplane system 100 interconnects card connectors 102 of electrical components, such as removable cards 104 (for example, network cards, PCB cards, line cards, switch cards, daughtercards and the like), using cable connector assemblies 106 of cable backplanes 108. Optionally, each removable card 104 may be coupled to a corresponding cable backplane 108. Alternatively, multiple removable cards 104 may be coupled to a corresponding cable backplane 108.

The cable connector assemblies 106 are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and may have a lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding card connectors 102 of the removable cards 104.

The cable backplane system 100 includes a chassis 110 (a portion shown in phantom in FIGS. 1-2) that supports the components of the cable backplane system 100. The chassis 110 may include a rack, a cabinet or other suitable structures for holding the components of the cable backplane system 100. The chassis 110 may include structures for guiding, supporting and/or securing the removable cards 104 in the cable backplane system 100. The chassis 110 may include structures for guiding, supporting and/or securing the cable backplanes 108 in the cable backplane system 100. The chassis 110 may include structures for supporting and/or managing the cables of the cable connector assemblies 106. In the illustrated embodiment, the chassis 110 supports a plurality of the cable backplanes 108 and a plurality of the removable cards 104 associated with the cable backplanes 108 arranged at different levels within the chassis 110 to define the cable backplane system 100. The cable backplanes 108 are oriented parallel to each other, such as in a horizontal orientation. The removable cards 104 are oriented parallel to each other and to the cable backplanes 108. The cable backplanes 108 may have any system architecture to interconnect the various cable connector assemblies 106. For example, in a full matrix type system, all cards talk to each other via cables. In a partial matrix system, data may be switched through cards to get to a final destination. Each card may be directly connected to any of the other cards. The cards can communicate through one or more of the cable connector assemblies 106. Other system architectures are possible such as a system where all line cards communicate with one or more switch cards. In such systems, the line cards may only communicate with each other through switch cards.

In an exemplary embodiment, airflow gaps 112 are defined between each of the levels of cable backplanes 108 and removable cards 104. The airflow gaps 112 are open at the front and the rear to allow airflow through the cable backplane system 100, such as for cooling the components of the cable backplane system 100. The cable backplane system 100 does not include a backplane, panel or other structure along the rear (for example, oriented vertically at the rear) to block the airflow, but rather is open to promote and allow airflow for cooling.

The removable card 104 may be a circuit board and may be manufactured from typical circuit board material, such as FR-4 material. The card connectors 102 are mechanically and electrically connected to the removable card 104. In the illustrated embodiment, the card connectors 102 are mounted to a top surface 114 of the removable card 104. The card connectors 102 may be right-angle connectors having mating interfaces 116 at a front of the card connectors 102 configured for mating with corresponding cable connector assemblies 106. The card connectors 102 may be receptacle connectors having mating contacts (not shown) configured for mating with the cable connector assemblies 106. The mating contacts may be pins, sockets, blades, receptacles, or other types of contacts. Guide modules 118 are provided on the removable card 104, such as adjacent to the corresponding card connectors 102 to guide mating with the cable connector assemblies 106 in a mating direction 128. The guide modules 118 may have openings to guide mating with the cable connector assemblies 106; however, other types of guide features, such as posts, may be used in alternative embodiments. Optionally, electrical components, such as power supplies, fans, connectors, and the like may be attached to the removable card 104. Such electrical components may be electrically connected to traces of the removable card 104.

In an exemplary embodiment, the removable cards 104 have carriers 120 attached thereto. The carriers 120 are used to support the removable cards 104. The carriers 120 may be used to load the removable cards 104 into the cable backplane system 100, such as into the chassis 110. The chassis 110 may have guide features for guiding the carriers 120 into the chassis 110. The carriers 120 each have a front panel 122. Optionally, the front panel 122 has openings 124, which may allow airflow through the front panel 122 into the airflow gaps 112. Optionally, wires or other components may pass through the openings 124. The carrier 120 has a bottom plate 126 extending from the front panel 122. The bottom plate 126 is generally planar and supports the removable card 104. The bottom plate 126 may be supported by the cable backplane 108. Optionally, the bottom plate 126 and the removable card 104 are parallel to and rest on the cable backplane 108. The carrier 120 may have other features or shapes in alternative embodiments.

The cable backplane 108 includes at least one tray 130 configured to be coupled to the chassis 110 and a plurality of the cable connector assemblies 106 mounted to each tray 130. The tray 130 supports the cable connector assemblies 106 and may support one or more of the removable cards 104. For example, the tray 130 may support one or more of the bottom plates 126. The trays 130 may be directly coupled to the chassis 110 and fixed relative to the chassis 110. The trays 130 may be removably coupled to the chassis 110. The trays 130 may be variably positionable relative to the chassis 110, such as at different vertical heights. In the illustrated embodiment, the trays 130 are oriented parallel to the loading or mating direction 128 of the removable cards, such as horizontally, however the trays 130 may be arranged at other orientations.

Each tray 130 includes a plate 132 extending between a front 134 and a rear 136. The plate 132 has a plurality of mounting locations 138 for the cable connector assemblies 106, such as proximate to the rear 136. The cable connector assemblies 106 are secured to the plate 132 at the mounting locations 138. The plate 132 is generally planar between the front 134 and the rear 136. In the illustrated embodiment, the plate 132 is a sheet metal plate; however the plate 132 may be manufactured from other materials in alternative embodiments. The plate 132 may be elongated and extend approximately an entire depth of the chassis 110 (for example, from front to rear). Alternatively, the plate 132 may be narrow and extend only partially between the front and the rear of the chassis 110, such as proximate to the rear of the chassis 110. In an exemplary embodiment, the plates 132 of the trays 130 are oriented parallel to each other with the airflow gaps 112 therebetween. Front openings 140 are defined between the fronts 134 of the plates 132 and rear openings 142 are defined between the rears 136 of the plates 132. The removable cards 104 are loaded between the plates 132 through the front openings 140. The cable connector assemblies 106 are accessible through the rear openings 142, such as for installation or removal of cable connector assemblies 106. Air is able to flow into or out of the airflow gaps 112 through the rear openings 142. The cables of the cable connector assemblies 106 may extend through the rear openings 142, such as for routing to other cable connector assemblies 106 within the chassis 110 and/or for routing to other cable connector assemblies 106 of another chassis (not shown).

The plate 132 may be a circuit board having electrical circuits. The plate 132 may be manufactured from typical circuit board material, such as FR-4 material. Optionally, electrical components, such as power supplies, fans, connectors, and the like may be attached to the plate 132. The cable connector assemblies 106 are not electrically connected to the plate 132, as is typical of conventional backplanes, but rather the cable connector assemblies 106 may be interconnected by cables extending between the cable connector assemblies 106.

The cable connector assemblies 106 are coupled to the plates 132 at the mounting locations 138. In the illustrated embodiment, the cable connector assemblies 106 are mounted to a top surface of the corresponding plate 132. Proper positioning of the cable connector assemblies 106 on the plate 132 may reduce mis-alignment and/or damage to the cable connector assemblies 106 and/or the card connectors 102. The cable connector assemblies 106 may have guide features to guide mating of the card connectors 102 with the cable connector assemblies 106 during loading of the removable cards 104 into the cable backplane system 100. For example, the cable connector assemblies 106 may have guide pins that are received in the guide modules 118 to guide mating.

The cable connector assemblies 106 each include a cable connector 148 held by a holder 150. The holder 150 is configured to be mounted to the corresponding mounting location 138 of the plate 132 and hold the relative position of the cable connector assembly 106 with respect to the plate 132. The holder 150 may be mounted to the plate 132 and removable from the plate 132 through the rear opening 142 at the rear 136 of the plate 132 without removal or disassembly of the cable backplane 108 from the chassis 110. As such, individual cable connector assemblies 106 may be removed and/or replaced. The holder 150 holds the cable connector 148 which is configured to be mated to the corresponding card connector 102 when the removable card 104 is mated to the cable backplane 108. The cable connector 148 includes a housing 152 holding contacts 154, the contacts 154 terminated to corresponding cables 156 and configured for mating with the mating contacts of the corresponding card connector 102 mated to the cable connector assembly 106.

Figure 3:
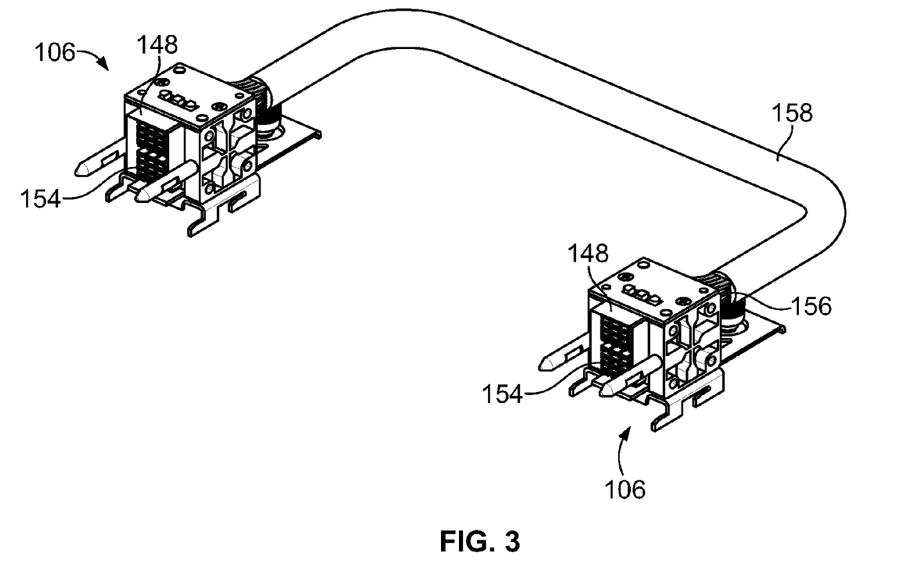
FIG. 3 is a front perspective view of a cable connector assembly formed in accordance with an exemplary embodiment.
Figure 4:
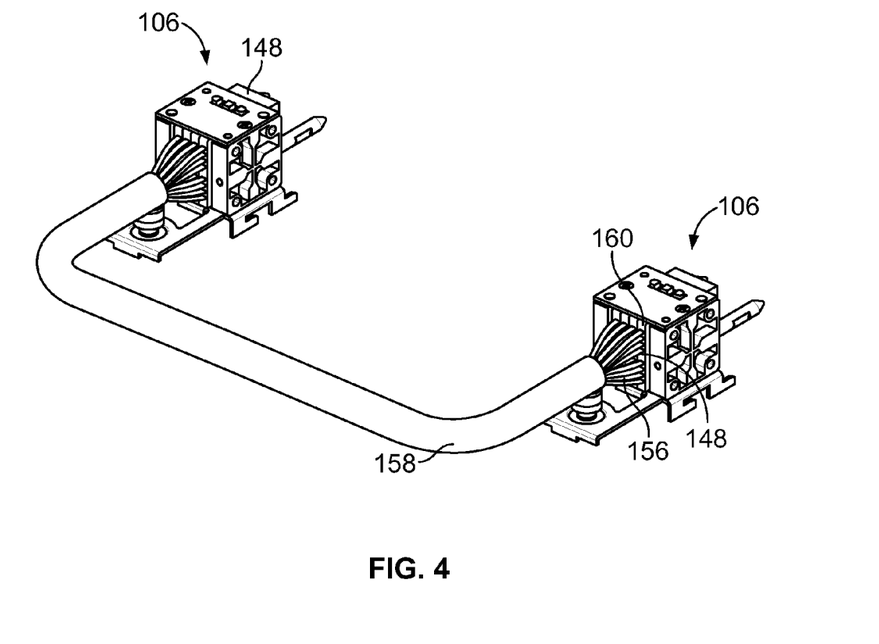
FIG. 4 is a rear perspective view of the cable connector assembly.

FIG. 3 is a front perspective view of the cable connector assemblies 106 formed in accordance with an exemplary embodiment. FIG. 4 is a rear perspective view of the cable connector assemblies 106. The cable connector assemblies 106 are connected by the cables 156, which may be arranged as a cable bundle 158 extending between the various cable connector assemblies 106. The cables 156 are terminated to the corresponding contacts 154 of the cable connector 148.

In the illustrated embodiment, all of the cables 156 from one cable connector assembly 106 are routed to another cable connector assembly 106; however, in other embodiments, at least some of the cables 156 may be routed to a different cable connector assembly 106. The cable connector assemblies 106 may be arranged as part of the same cable backplane 108 (shown in FIG. 1), as part of different cable backplanes 108 within the same chassis 110 (shown in FIG. 1), or may be arranged as parts of different cable backplanes 108 in different chassis 110 by routing the cables 156 between the different locations within the system and/or between different chassis.

Optionally, the cable connectors 148 may be identical to one another. The cable connectors 148 may define header connectors. The cable connectors 148 are configured to be mated with corresponding card connectors 102 (shown in FIG. 1), which may be receptacle connectors, such as STRADA Whisper receptacle connectors, commercially available from TE Connectivity, Harrisburg, Pa. In an exemplary embodiment, the cable connector 148 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 156 are twin axial cables having two signal wires within a common jacket of the cable 156. The signal wires convey differential signals. In an exemplary embodiment, the signal wires are shielded, such as with a cable braid of the cable 156. Optionally, each of the signal wires may be individually shielded. Other types of cables 156 may be provided in alternative embodiments. For example, coaxial cables may extend from the cable connector 148 each carrying a single signal conductor therein.

Figure 5:
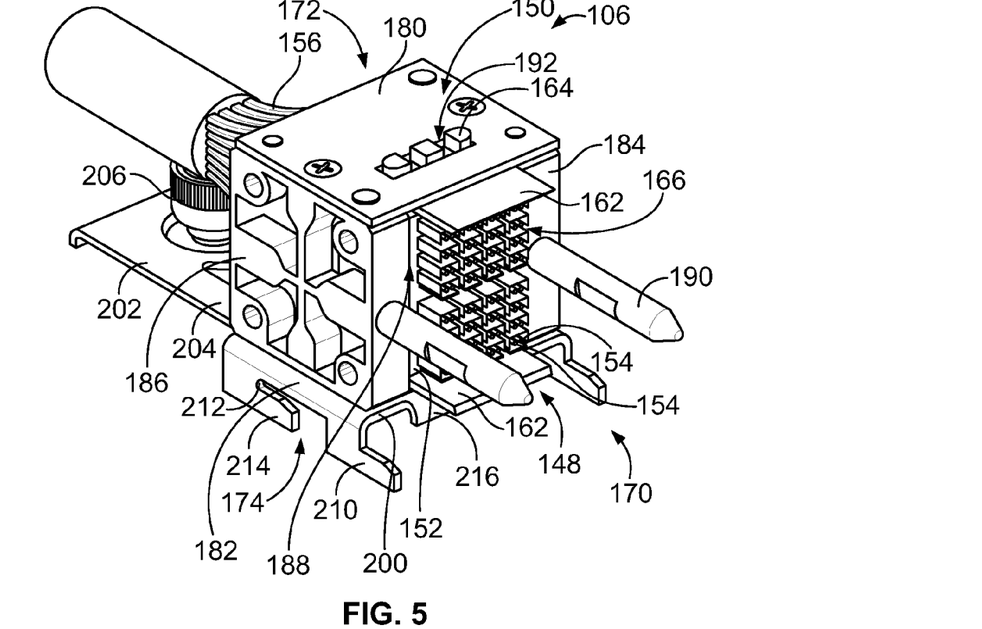
FIG. 5 is a top perspective view of the cable connector assembly.
Figure 6:
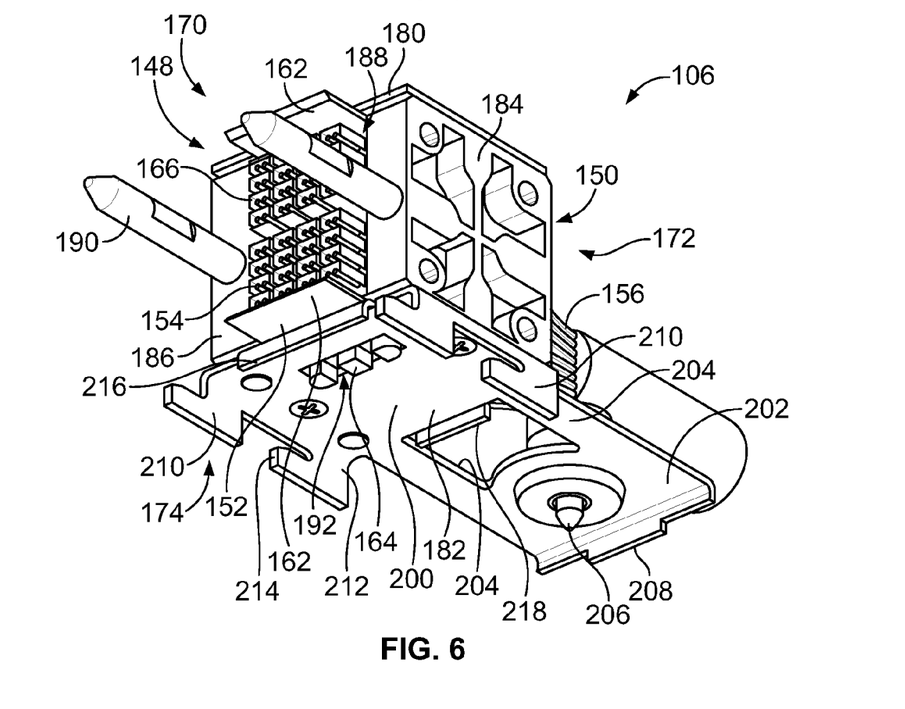
FIG. 6 is a bottom perspective view of the cable connector assembly.

FIG. 5 is a top perspective view of one of the cable connector assemblies 106. FIG. 6 is a bottom perspective view of one of the cable connector assemblies 106. The cable connector 148 includes the housing 152 which may hold a plurality of contact modules 160 (shown in FIG. 4). The housing 152 includes shroud walls 162 that define a mating cavity configured to receive the corresponding card connector 102. The shroud walls 162 guide mating of the card connector 102 with the cable connector 148. In an exemplary embodiment, the housing 152 has lugs 164 extending outward from the walls 162. The lugs 164 are used to locate the cable connector 148 with respect to the holder 150.

In an exemplary embodiment, the signal contacts 154 are arranged in pairs terminated to corresponding signal wires of the cable 156. Ground shields 166 provide shielding for the signal contacts 154. In an exemplary embodiment, each ground shield 166 peripherally surrounds a corresponding pair of the signal contacts 154 along the entire length of the pair of signal contacts 154 to ensure that the signal paths are electrically shielded from interference. The ground shields 166 may include a plurality of walls surrounding the corresponding pair of signal contacts 154 on multiple sides. For example, the ground shields 166 may be C-shaped surrounding the corresponding pair of signal contacts 154 on three sides.

The cable connector assembly 106 has a mating end 170 opposite a cable end 172. The cables 156 extend from the cable end 172. The holder 150 extends along a bottom 174 of the cable connector assembly 106. The bottom 174 is configured to be mounted to the plate 132 (shown in FIG. 1). In an exemplary embodiment, the holder 150 is a separate structure that holds the housing 152 of the cable connector 148. In other embodiments, the holder 150 is defined, at least in part, by the housing 152. For example, walls of the housing 152 may define the holder 150. The holder 150 includes a top plate 180, a bottom plate 182 and side plates 184, 186 defining a cavity 188 with the housing 152 disposed therein. The top and bottom plates 180, 182 may be secured to the side plates 184, 186 using fasteners or other securing means.

Optionally, the holder 150 includes guide posts 190 extending forward of the housing 152. The guide posts 190 are configured to be received in the guide modules 118 (shown in FIG. 2) to guide mating of the cable connector assembly 106 with the card connector 102. Other types of guide features may be used in alternative embodiments.

The top and bottom plates 180, 182 include locating openings 192 that receive the lugs 164 of the housing 152 to locate the cable connector 148 relative to the holder 150. Optionally, the locating openings 192 may be oversized relative to the lugs 164 to allow a limited amount of floating movement of the cable connector 148 within the holder 150. The oversized openings define gaps around the lugs 164, and the size of the gaps defines the amount of allowable float. The floating movement accommodates manufacturing tolerances in the holder 150, the cable connector 148, the plate 132, the card connector 102, and the like. The locating openings 192 may allow floating in the mating direction (for example, front-to-back) and/or in a lateral direction (for example, side-to-side). Optionally, the gaps may allow approximately 1.0 mm of float in the mating and/or lateral directions; however the gaps may allow more or less float in alternative embodiments.

The bottom plate 182 includes a base 200 and a tail 202 extending rearward from the base 200. The tail 202 includes flexible beams 204 to allow relative movement between the base 200 and the tail 202. The tail 202 holds a fastener 206 used to secure the cable connector assembly 106 to the plate 132 of the tray 130. The fastener 206 may be a threaded fastener. The fastener 206 may be a captive screw coupled to the tail 202.

The tail 202 includes a positioning tab 208 extending therefrom. The positioning tab 208 may be provided at a rear of the tail 202. The positioning tab 208 may extend downward from the tail 202 to engage the plate 132. The positioning tab 208 is used to hold a position of the cable connector assembly 106 relative to the plate 132.

The bottom plate 182 includes a plurality of mounting tabs 210 extending therefrom below the bottom plate 182. The mounting tabs 210 are configured to locate the cable connector assembly 106 relative to the plate 132 of the tray 130. Any number of mounting tabs 210 may be provided. The mounting tabs 210, in the illustrated embodiment, are provided at the outer edges of the bottom plate 182 along the base 200. In the illustrated embodiment, the mounting tabs 210 are L-shaped having a leg portion 212 and a foot portion 214 extending from the leg portion 212. Other shapes or features are possible in alternative embodiments.

The bottom plate 182 includes front and rear support tabs 216, 218 at the front and the rear, respectively, of the base 200. The front and rear support tabs 216, 218 may be deflectable. The support tabs 216, 218 may be used to support the base 200 on the plate 132 and provide tension or a holding force on the mounting tabs 210.

In an exemplary embodiment, the bottom plate 182 is stamped and formed from a sheet metal plate. The tabs 208, 210, 216, 218 may be bent or folded from the sheet metal plate in a forming operation. The bottom plate 182 may include other tabs in alternative embodiments.

Figures 7, 8:
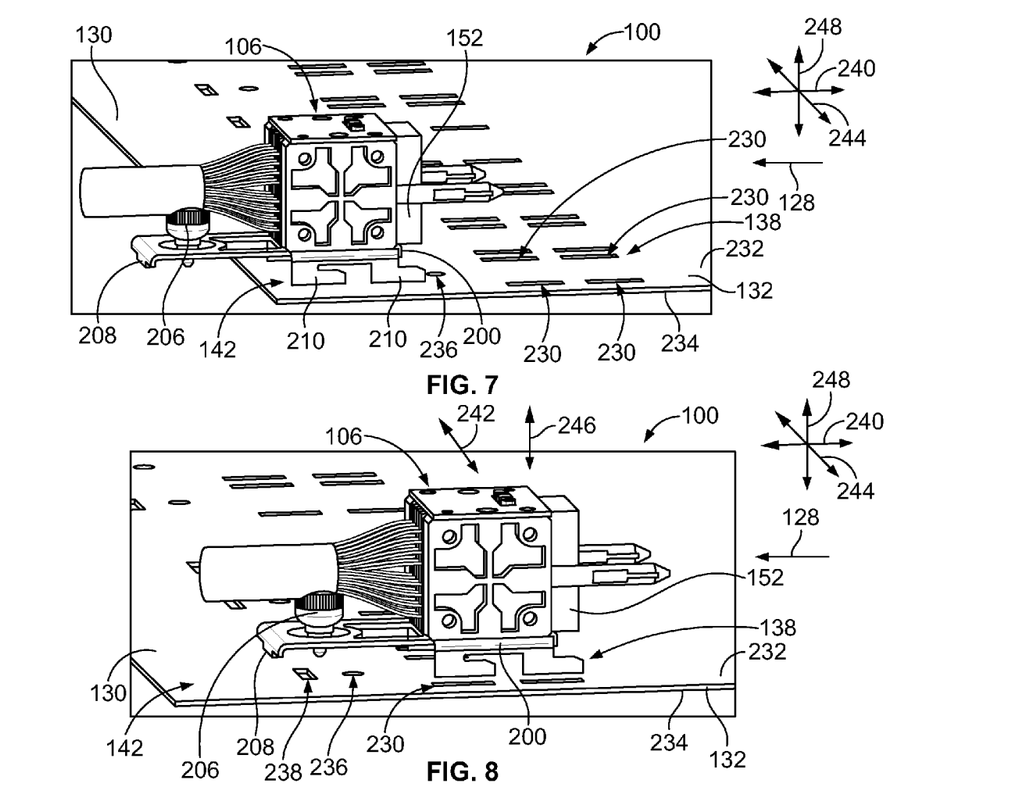
FIG. 7 illustrates a portion of the cable backplane system showing one of the cable connector assemblies poised for mounting to a plate of a tray.
FIG. 8 illustrates a portion of the cable backplane system showing one of the cable connector assemblies poised for mounting to the plate of the tray.
Figure 9:
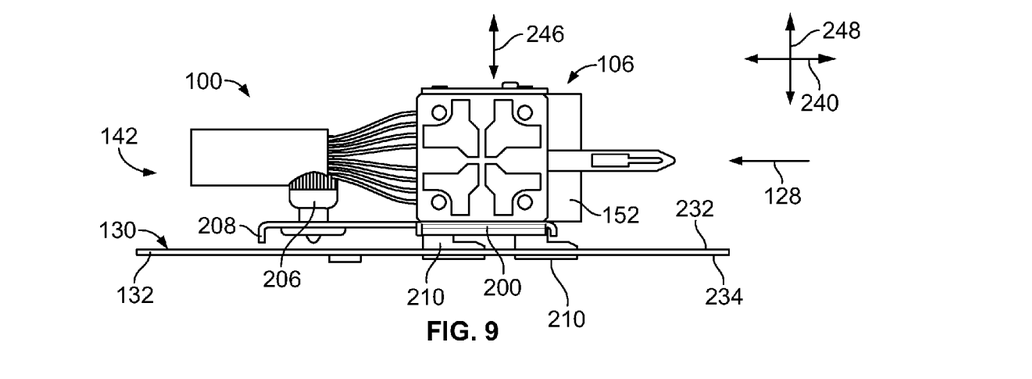
FIG. 9 is a side view of the cable backplane system showing one of the cable connector assemblies partially mounted to the plate of the tray.

FIG. 7 illustrates a portion of the cable backplane system 100 showing one of the cable connector assemblies 106 positioned rearward of the mounting location 138 of the plate 132 of the tray 130. FIG. 8 illustrates a portion of the cable backplane system 100 showing one of the cable connector assemblies 106 poised for mounting to the plate 132 of the tray 130. FIG. 9 is a side view of the cable backplane system 100 showing one of the cable connector assemblies 106 partially mounted to the plate 132 of the tray 130. The plate 132 includes a plurality of slots 230 in the mounting locations 138. The slots 230 are configured to receive corresponding mounting tabs 210. In the illustrated embodiment, the slots 230 pass through the plate 132 between a top surface 232 and a bottom surface 234 of the plate 132. Alternatively, the plate 132 may include a strap or band bent upward above the top surface 232 with a corresponding slot formed below the band to capture the mounting tab 210. The plate 132 includes a fastener 236 configured to interact with the fastener 206 to secure the cable connector assembly 106 to the plate 132. For example, the fastener 236 may include an opening. The fastener 236 may include a threaded nut. The plate 132 includes a rear slot 238 configured to receive the positioning tab 208.

During assembly, the cable connector assembly 106 is loaded into position above the top surface 232 until the mounting tabs 210 are aligned with the corresponding slots 230. In an exemplary embodiment, the cable connector assembly 106 is rear loaded into position through the rear opening 142. The cable connector assembly 106 is loaded in a forward direction through the rear opening 142 parallel to the mating direction 128 along a mating axis 240. The cable connector assembly 106 may be moved side-to-side in a lateral direction 242 parallel to a lateral axis 244 to align the mounting tabs 210 with the slots 230. Once aligned with the mounting location 138, the cable connector assembly 106 is moved downward toward the plate 132 in a vertical direction 246 parallel to an elevation axis 248. The axes 240, 244, 248 are mutually perpendicular axes such that the vertical direction 246 is perpendicular to the mating direction 128 and the lateral direction 242 is perpendicular to the mating direction 128 and perpendicular to the vertical direction 246. When assembled, the base 200 is positioned between the housing 152 and the plate 132. FIG. 9 shows the mounting tabs 210 partially loaded into the slots 230 (FIG. 8).

Figure 10:
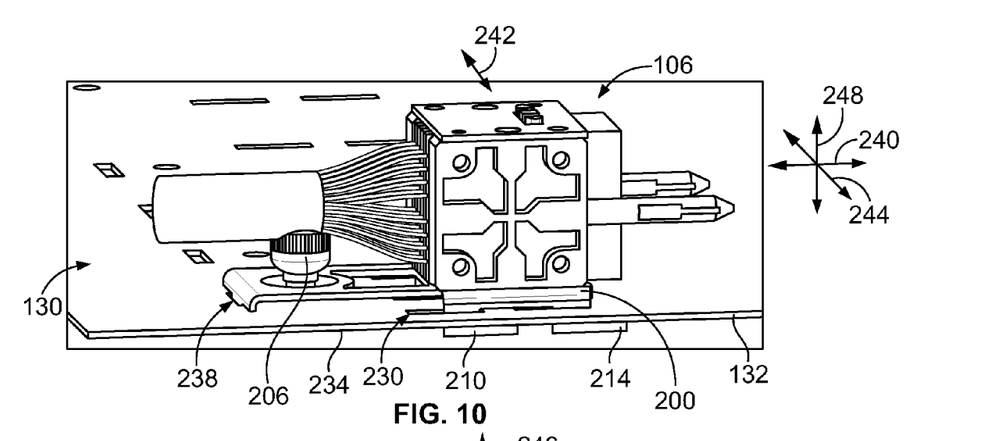
FIG. 10 is a rear perspective view of the cable connector assembly coupled to the plate of the tray.
Figure 11:
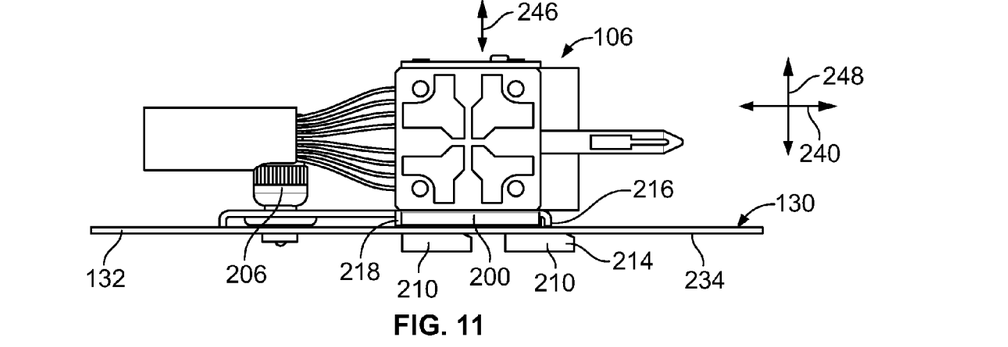
FIG. 11 is a side view of the cable connector assembly coupled to the plate of the tray.
Figure 12:
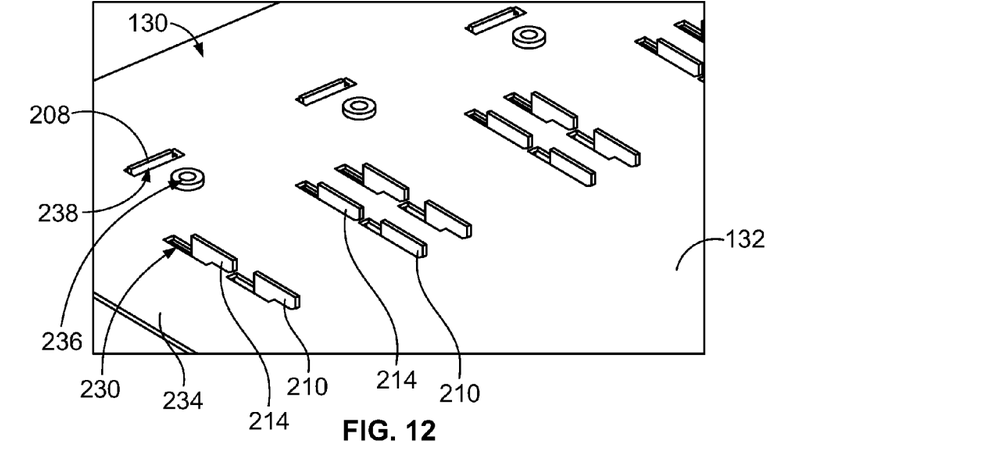
FIG. 12 is a bottom view of the cable connector assembly coupled to the plate of the tray.

FIG. 10 is a rear perspective view of the cable connector assembly 106 coupled to the plate 132 of the tray 130. FIG. 11 is a side view of the cable connector assembly 106 coupled to the plate 132 of the tray 130. FIG. 12 is a bottom view of the cable connector assembly 106 coupled to the plate 132 of the tray 130. During assembly, the mounting tabs 210 are loaded into the slots 230. The mounting tabs 210 pass through the slots 230 and are configured to be captured below the plate 132. Once fully loaded, the cable connector assembly 106 can be slid forward to an advanced position (shown in FIGS. 10-12). The mounting tabs 210 engage the plate 132 in the advanced position. The feet portions 214 of the mounting tabs 210 are captured below the bottom surface 234. The plate 132 is captured between the top edges of the feet portions 214 and the base 200, such as the support tabs 216, 218 of the base 200. When the mounting tabs 210 are received in the slots 230, the cable connector assembly 106 is restricted from moving in the lateral direction 242 along the lateral axis 244 (for example, side-to-side). When the mounting tabs 210 are received in the slots 230, the cable connector assembly 106 is restricted from moving in the vertical direction 246 along the elevation axis 248 (for example, up and/or down).

Optionally, the support tabs 216, 218 are flexible and are at least partially deflected against the plate 132 as the mounting tabs 210 are moved into position along the plate 132. The support tabs 216, 218 may allow a limited amount of floating movement of the cable connector assembly 106 relative to the plate 132, such as along the elevation axis 248. The vertical floating may allow the cable connector assembly 106 to align with the card connector 102 (shown in FIG. 1) during mating with the card connector 102.

During assembly, the cable connector assembly 106 is slid forward to the advanced position to align the positioning tab 208 with the rear slot 238. When the positioning tab 208 is received in the rear slot 238, the cable connector assembly 106 is restricted from moving along the mating axis 240 (for example, front-to-back). When the positioning tab 208 is received in the rear slot 238, the fastener 206 is aligned with the fastener 236. The fastener 206 may be secured to the plate 132, such as by threadably coupling the fastener 206 to the fastener 236, which may be a threaded opening or may include a threaded nut, to lock the cable connector assembly 106 to the plate 132.

Figure 13:
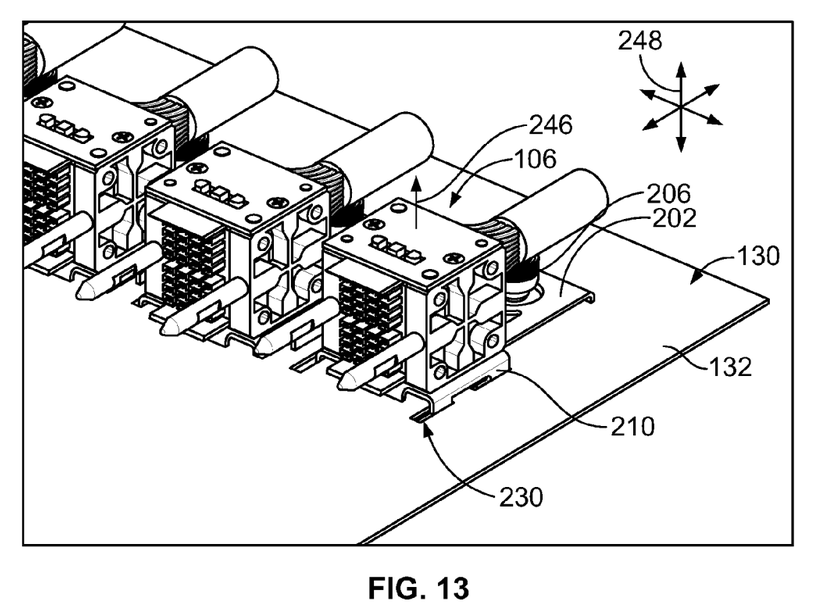
FIG. 13 is a front perspective view of the cable connector assembly being removed from the plate of the tray.
Figure 14:
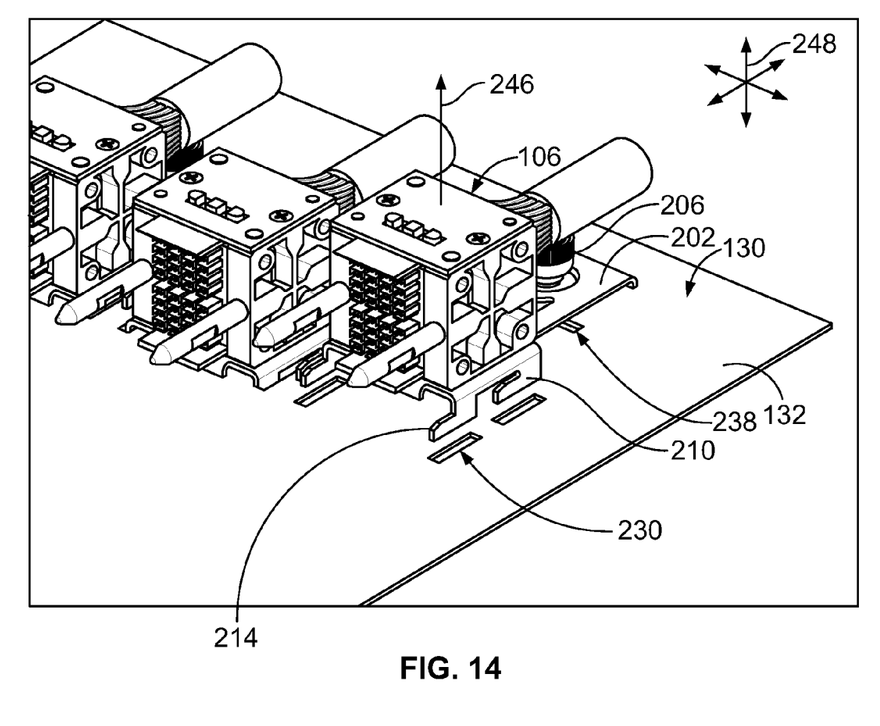
FIG. 14 is a front perspective view of the cable connector assembly being removed from the plate of the tray.
Figure 15:
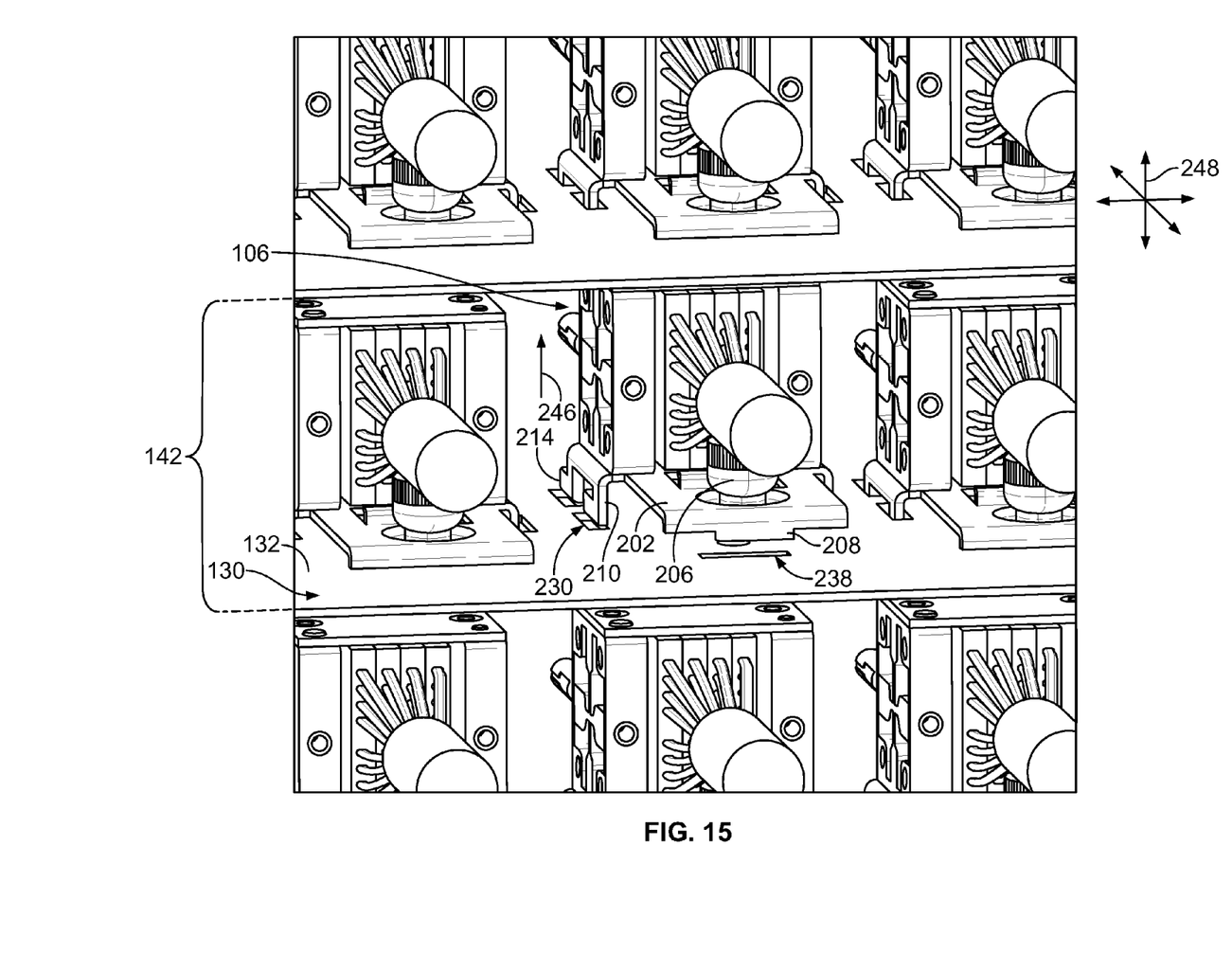
FIG. 15 is a rear perspective view of the cable connector assembly being removed from the plate of the tray.

FIG. 13 is a front perspective view of one of the cable connector assemblies 106 being removed from the plate 132 of the tray 130. FIG. 14 is a front perspective view of one of the cable connector assemblies 106 being removed from the plate 132 of the tray 130. FIG. 15 is a rear perspective view of one of the cable connector assemblies 106 being removed from the plate 132 of the tray 130. The cable connector assemblies 106 may be individually removed from the plate 132 without removing other cable connector assemblies 106 and/or the trays 130, such as for repair, replacement or repositioning. The cable connector assembly 106 is removed through the rear opening 142. By having the rear opening 142 open, the cable connector assemblies 106 are able to be installed and removed easily without affecting other components of the system.

During removal, the fastener 206 may be unfastened from the plate 132. The tail 202 may be lifted upward to remove the positioning tab 208 (FIG. 15) from the rear slot 238. The cable connector assembly 106 is then able to be slid rearward to a retracted position (FIG. 13). In the retracted position, the feet portions 214 of the mounting tabs 210 are aligned with the slots 230 and no longer blocked by the plate 132. The cable connector assembly 106 is able to be lifted upward in the vertical direction 246 along the elevation axis 248 to a clearance position (FIGS. 14 and 15) where the mounting tabs 210 are clear of the plate 132. The cable connector assembly 106 can then be removed through the rear opening 142.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising: cable backplanes each comprising a tray configured to be coupled to a chassis and a plurality of cable connector assemblies mounted to the tray; the tray having a plate extending between a front and a rear, the plate having mounting locations receiving corresponding cable connector assemblies, the trays of the cable backplanes being oriented parallel to each other with front openings between the fronts of the plates and with rear openings between the rears of the plates; each cable connector assembly having a housing holding contacts, the contacts terminated to corresponding cables and configured for mating with mating contacts of a corresponding card connector when mated to the cable connector assembly in a mating direction parallel to the plates, each cable connector assembly having a holder mounted to the corresponding mounting location of the plate, the holder being mounted to the plate and removable from the plate through the rear opening at the rear of the plate.

2. The cable backplane system of claim 1, wherein the trays are oriented to allow airflow along the plates between the front openings and the rear openings, the airflow passing the cable connector assemblies.

3. The cable backplane system of claim 1, wherein the plate is configured to support a removable card including the corresponding card connectors.

4. The cable backplane system of claim 1, wherein the cable connector assembly has a mating end opposite a cable end, the cables extending from the cable end, the holder extending along a bottom of the cable connector assembly, the bottom being mounted to the plate.

5. The cable backplane system of claim 1, wherein the plate includes a plurality of slots in the mounting locations, the holder including mounting tabs received in corresponding slots to locate the cable connector assembly relative to the plate.

6. The cable backplane system of claim 5, wherein the mounting tabs pass through the slots and are captured below the plate.

7. The cable backplane system of claim 1, wherein the holder includes a bottom plate having a base between the housing and the plate and a tail extending rearward from the base, the tail having a fastener engaging the plate for securing the cable connector assembly to the plate.

8. The cable backplane system of claim 7, wherein the tail includes flexible beams to allow relative movement between the base and the tail.

9. The cable backplane system of claim 1, wherein the plate includes a plurality of slots, the holder includes mounting tabs received in corresponding slots and engaging the plate to secure the cable connector assembly in a vertical direction perpendicular to the mating direction and to secure the cable connector assembly in a lateral direction perpendicular to the mating direction and perpendicular to the vertical direction.

10. The cable backplane system of claim 9, wherein the holder includes a positioning tab received in a rear slot and engaging the plate to secure the cable connector assembly in the mating direction.

11. The cable backplane system of claim 9, wherein the mounting tabs are received in the slots and then the cable connector assembly is slid forward to an advanced position to allow the mounting tabs to engage the plate, the holder having a fastener being aligned with a corresponding fastener of the plate in the advanced position, the fastener of the holder interacting with the fastener of the plate to lock the cable connector assembly to the plate.

12. The cable backplane system of claim 1, wherein the holder includes a top plate, a bottom plate and side plates defining a cavity with the housing disposed therein, the bottom plate having a plurality of mounting tabs extending therefrom below the bottom plate, the mounting tabs being configured to locate the cable connector assembly relative to the tray, the bottom plate having a fastener configured to engage the tray to secure the cable connector assembly to the tray.

13. The cable backplane system of claim 1, wherein the plate is a circuit board.

14. The cable backplane system of claim 1, wherein the holder is a separate structure coupled to the housing.

15. A cable backplane system comprising: cable backplanes each comprising a tray configured to be coupled to a chassis and a plurality of cable connector assemblies mounted to the tray; the tray having a plate extending between a front and a rear, the plate having mounting locations receiving corresponding cable connector assemblies, the plate having slots at the mounting locations, the trays of the cable backplanes being oriented parallel to each other with front openings between the fronts of the plates and with rear openings between the rears of the plates; each cable connector assembly having a housing holding contacts the contacts terminated to corresponding cables and configured for mating with mating contacts of a corresponding card connector mated to the cable connector assembly in a mating direction parallel to the plates, each cable connector assembly having a holder mounted to the corresponding mounting location of the plate, the holder having a base below the contacts with mounting tabs extending therefrom, the mounting tabs being received in corresponding slots in the plate to locate the cable connector assembly relative to the plate, the holder having a fastener removably fastened to the plate to secure the cable connector assembly to the plate.

16. The cable backplane system of claim 15, wherein the trays are oriented to allow airflow along the plates between the front openings and the rear openings, the airflow passing the cable connector assemblies.

17. The cable backplane system of claim 15, wherein the cable connector assembly has a mating end opposite a cable end, the cables extending from the cable end, the holder extending along a bottom of the cable connector assembly, the bottom being mounted to the plate.

18. The cable backplane system of claim 15, wherein the mounting tabs engage the plate to secure the cable connector assembly in a vertical direction perpendicular to the mating direction and to secure the cable connector assembly in a lateral direction perpendicular to the mating direction and perpendicular to the vertical direction.

19. The cable backplane system of claim 15, wherein the holder includes a positioning tab received in a rear slot in the plate and engaging the plate to secure the cable connector assembly in the mating direction.

\* \* \* \* \*